US006664620B2

(12) United States Patent
Siu et al.

(10) Patent No.: US 6,664,620 B2
(45) Date of Patent: *Dec. 16, 2003

(54) INTEGRATED CIRCUIT DIE AND/OR PACKAGE HAVING A VARIABLE PITCH CONTACT ARRAY FOR MAXIMIZATION OF NUMBER OF SIGNAL LINES PER ROUTING LAYER

(75) Inventors: William M. Siu, Paradise Valley, AZ (US); Bidyut K. Bhattacharyya, Phoenix, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 113 days.

(21) Appl. No.: 09/342,550

(22) Filed: Jun. 29, 1999

(65) Prior Publication Data

US 2001/0045633 A1 Nov. 29, 2001

(51) Int. Cl.⁷ .................. H01L 23/48; H01L 23/52; H01L 29/40
(52) U.S. Cl. .................. 257/692; 257/690; 257/786; 257/773; 257/737; 257/738; 257/780; 257/778; 257/698
(58) Field of Search .................. 257/690, 692, 257/786, 738, 778, 737, 698, 694, 965, 686, 780

(56) References Cited

U.S. PATENT DOCUMENTS

| 3,707,655 | A | * | 12/1972 | Rudolph et al. | ........ 317/234 R |
| 4,495,377 | A | * | 1/1985 | Johnson et al. | ............ 174/68.5 |
| 4,875,138 | A | * | 10/1989 | Cusack | ........ 174/52.4 |
| 5,089,881 | A | | 2/1992 | Panicker | |
| 5,091,822 | A | * | 2/1992 | Takashima | .................. 361/384 |
| 5,309,024 | A | * | 5/1994 | Hirano | ........ 257/773 |
| 5,324,985 | A | | 6/1994 | Hamada et al. | |
| 5,463,191 | A | | 10/1995 | Bell et al. | |
| 5,468,994 | A | | 11/1995 | Pendse | |
| 5,484,963 | A | * | 1/1996 | Washino | ........ 174/261 |
| 5,491,364 | A | * | 2/1996 | Brandenburg et al. | ...... 257/786 |
| 5,686,699 | A | | 11/1997 | Chu et al. | |
| 5,686,764 | A | * | 11/1997 | Fulcher | ........ 527/778 |
| 5,702,256 | A | | 12/1997 | Severn | |
| 5,713,744 | A | | 2/1998 | Laub | |
| 5,729,894 | A | | 3/1998 | Rostoker et al. | |
| 5,952,726 | A | * | 9/1999 | Liang | ........ 257/778 |
| 6,310,398 | B1 | * | 10/2001 | Katz | ........ 257/773 |

FOREIGN PATENT DOCUMENTS

WO    PCT/US 00/14904    5/2000

* cited by examiner

Primary Examiner—Steven Loke
Assistant Examiner—Nitin Parekh
(74) Attorney, Agent, or Firm—Blakely, Sokoloff, Taylor & Zafman LLP

(57) ABSTRACT

An integrated circuit die and/or package. An apparatus is described having a substrate with a central region and an outer region. A first plurality of electrical connections is spaced apart by a first distance on the outer region of the substrate. A second plurality of electrical connections is spaced apart by a second distance, smaller than the first distance, on the central region of the substrate.

18 Claims, 2 Drawing Sheets

US 6,664,620 B2

INTEGRATED CIRCUIT DIE AND/OR PACKAGE HAVING A VARIABLE PITCH CONTACT ARRAY FOR MAXIMIZATION OF NUMBER OF SIGNAL LINES PER ROUTING LAYER

BACKGROUND OF THE INVENTION

1. Field of the Invention

The present invention relates to the field of integrated circuits and packages. More particularly, the present invention relates to an integrated circuit and/or a grid array package having a progressively variable pitch.

2. Description of Related Art

Over the years, the electronics industry has minimized the size of integrated circuit chip designs. As integrated circuits become more dense and therefore smaller, the packaging of integrated circuit becomes more complex. As a consequence, more and more input and output (I/O) connections become available for use with a single integrated circuit. For example, an integrated circuit with a size of 0.5 inches square can easily require 400 or more connections.

Some of the latest microprocessor devices are packaged in land grid array (LGA) packages or modules. The LGA package style comprises an array of planar, typically rectangular or circular, conductive pads located on an underside of the IC package for surface contact with leads on a PCB. The array of pads is typically in a multiple row, multiple column arrangements, creating a matrix of surface contacts. LGA packages are ideal for devices such as microprocessors. The LGA package uses pads instead of pins, which are more susceptible to damage, to provide the required electrical connections between the integrated circuit device and the circuit board, allowing the pitch of the electrical contacts to be very small.

A package for carrying an integrated circuit die having a high density of input/output pads will typically include signal traces that fan out with distance from the die. The bond wires have inner lead ends connected to the input/output pads of the die and have outer lead ends that connect to the inner trace ends of the signal traces which typically serve as bond sites. By fanning out with departure from the die, the array of signal traces may be considered to be a "space transformer." The ends of the signal traces furthest from the die may be spaced apart by greater distances, allowing the use of vias and solder bumps. The space transformation accommodates the high-density input/output pads of the integrated circuit die.

However, various constraints limit the number of signal traces that can be fabricated on an integrated circuit die or package using an array layout. Industry standards and other process issues impose specific requirements as to the spacing between electrical contacts (e.g., electrically conductive bumps such as solder bumps), thereby restricting the spacing between the vias that electrically connect the signal traces to the solder bumps. The spacing restriction limits the number of signal traces that can fit between the vias which, in turn, limits the number of signal traces that can be used to carry signals to and from the die. Current fabrication technology imposes minimum pitch requirements for signal traces to attain satisfactory yields and to ensure mechanical and electrical reliability. The limitation on the maximum number of usable signal traces limits the maximum number of solder bumps, thereby placing a ceiling on the number of signals that a particular die and/or package can provide.

It is necessary in the attempts to increase the number of signals a particular package can provide to increase the number of signal traces used to carry signals to and from the die. Currently, present design rules provide for designing packages having an approximate 50 mil fixed pitch for every row and integrated circuit dies having an approximate 10 mil fixed pitch for every row. This results in approximately 236 signal traces for a given routing layer. One method of increasing the number of signal traces per given routing layer is through use of a variable pitch design at every row of contacts.

SUMMARY OF THE INVENTION

The present invention discloses an integrated circuit die and/or package. In both cases, the package and/or die have a substrate with a central region and an outer region. A first plurality of electrical connections is spaced apart by a first distance on the outer region of the substrate. A second plurality of electrical connections is spaced apart by a second distance, smaller than the first distance, on the central region of the substrate.

BRIEF DESCRIPTION OF THE DRAWINGS

The invention is further described by way of example with reference to the accompanying drawings, wherein.

DETAILED DESCRIPTION

The present invention discloses to a grid array layout having a progressively variable pitch to enable a maximum number of signal lines to be routed through the grid layout. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well-known materials or methods have not been described in detail in order to avoid unnecessarily obscuring the present invention.

An electrical apparatus generally has a substrate with numerous points of electrical contact with signal traces extending from each point of electrical contact to provide paths for electrical connections between, for example, an IC die and a package between IC packages, between an IC package and a printed circuit board (PCB), between PCB's, etc. The present invention describes an improved layout of the electrical contacts to allow for increased density without increased complexity in construction or increased costs. Although the present invention is applicable in numerous applications including the electrical interconnections between an IC die and package, between a package and a PCB, between multiple PCB's, etc., for illustrative purposes only, the following discussion will reference the electrical contacts on the substrate of an IC package.

Figure 1:
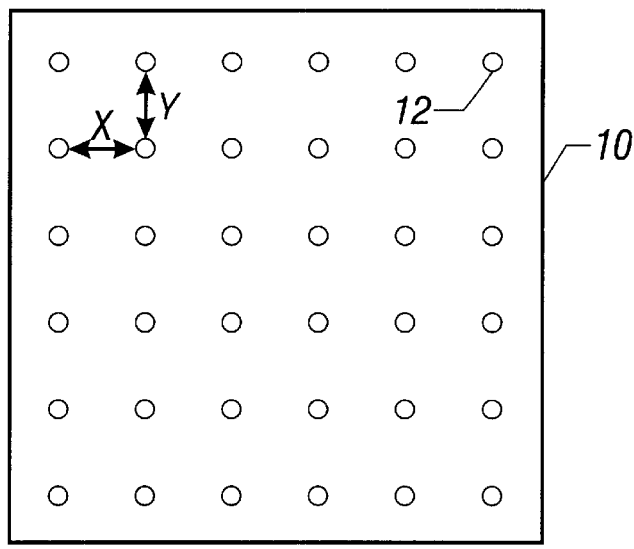
FIG. 1 is an illustration of a footprint of a substrate having electrical contacts positioned in a fixed pitch grid array layout.

Traditional flip chip packages (i.e., packages having a control collapsed chip connection (C4)), whether ball grid array (BGA) or land grid array (LGA) packages, have been fabricated having a fixed pitch grid array. FIG. 1 is an illustration of a footprint of a substrate 10 having electrical contacts 12 positioned in a fixed pitch grid array layout. The distance X between each contact 12 (i.e., the pitch) is the same for each row of contacts 12. Similarly, the distance Y between each contact 12 is the same for each column of contacts 12. The contacts 12 are generally positioned such that X and Y are the same or approximately the same distance. A standard layout positions the contacts 12 at a constant pitch (X) of 50 mils.

Figure 2:
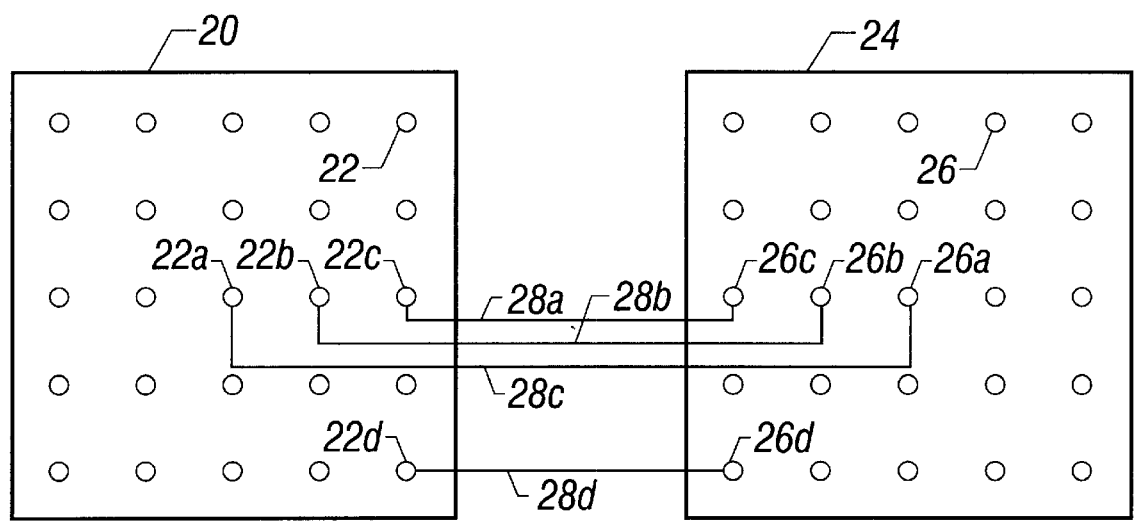
FIG. 2 is an illustration of the electrical connection between two packages or dies through use of a plurality of traces.

FIG. 2 is an illustration of the electrical connection of a first package 20 having contacts 22 to a second package 24 having contacts 26 through use of the plurality of traces 28 (also referred to as tracks or routing channels.) As apparent in FIG. 2, the connection of external or outer contacts, such as contacts 22d and 26d, is uncomplicated and achieved through use of a trace 28d. However, the electrical connection of more internal or central contacts, such as 22a and 26a, is more difficult. As with contacts 22a and 22d, the electrical connection is still made by a trace 28c. The space (or pitch) between the contacts along the outer region of the packages 20 and 24, however, becomes crowded with the numerous traces that must negotiate a path from the contacts located in the central region to the outer region of the packages 20 and 24. Thus, the desired number of traces required for a given design dictates the spacing of the outer region of contacts on a substrate. Since packages have previously been constructed with a constant pitch grid array, the density of a package and its connection is thus limited by the number of traces that can be designed to extend between a package's contacts.

The present invention provides a novel grid array wherein the grid array has a progressively variable pitch layout. In other words, the electrical contacts along the outer region of the grid array are spaced further apart than the contacts in the central region of the grid array. This variation in the spacing between contacts allows room for more traces (or routing channels) between the outer contacts.

Figure 3:
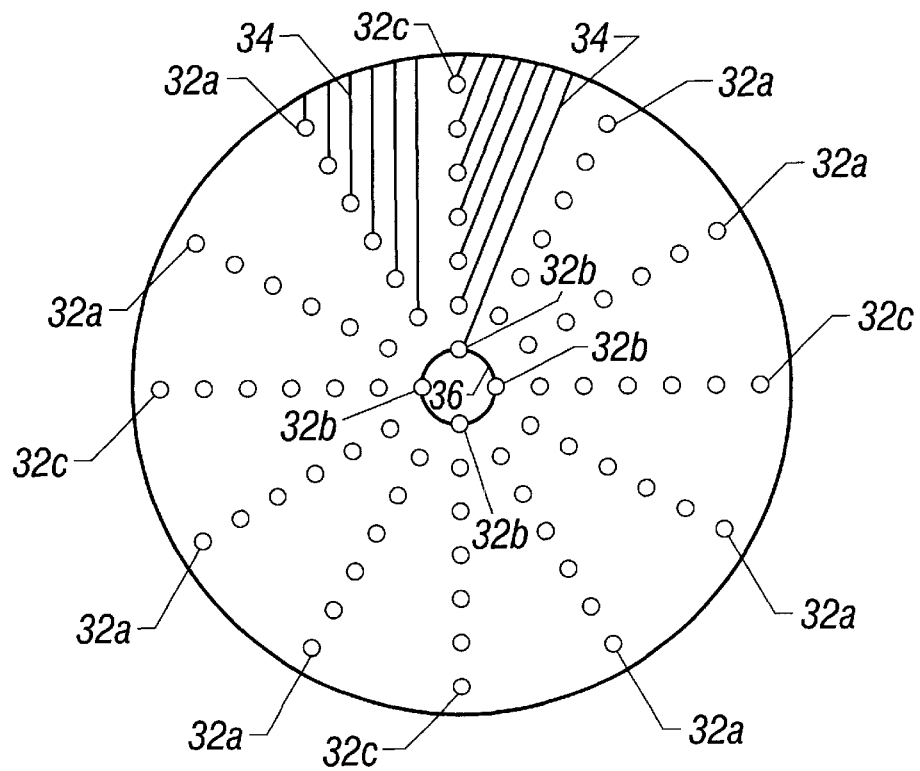
FIG. 3 is an illustration of a footprint of a circular package or die using the variable pitch layout of the present invention.

FIG. 3 is an illustration of a footprint of a circular package using the progressive pitch layout of the present invention. Contacts 32 are positioned on the substrate 30 in a circular or starburst pattern to most efficiently use the footprint of the substrate 30. The circular layout of the present invention positions the contacts 32 at the central region of the substrate closer together than the contacts 32 at the outer region of the substrate 30. In other words, as the array of contacts 32 is traversed from the central most point to the outside edge of the substrate 40, the spacing between the contacts 32 increases. In this manner, there is room for the numerous traces 34 to pass between the contacts 32 along the outer region of the substrate 30.

In FIG. 3, note that the relative size of the contacts 32 is approximately the same both at the central and outer regions of the substrate 30. Although the exact spacing between the contacts 32 is a design decision based upon the desired number of contacts 32 and routing channels 34 in a given design, FIG. 3 provides an illustrative spacing for one embodiment of a circular grid array package utilizing the progressive pitch layout of the present invention. In this embodiment, no routing channels 34 pass between the inner contacts 32b, but the spacing between outer contacts 32a allow for 6 routing channels to pass between the outer contacts 32a.

Contacts 32c along the outer region of the package 30 have been removed for handling purposes. The number of contracts 32c removed for handling, and their given location within the grid array, is purely a design decision. Note also that a power an/or ground ring 36 may be placed anywhere along the grid array but will typically be located near the central region of the substrate 30 as shown.

Figure 4:
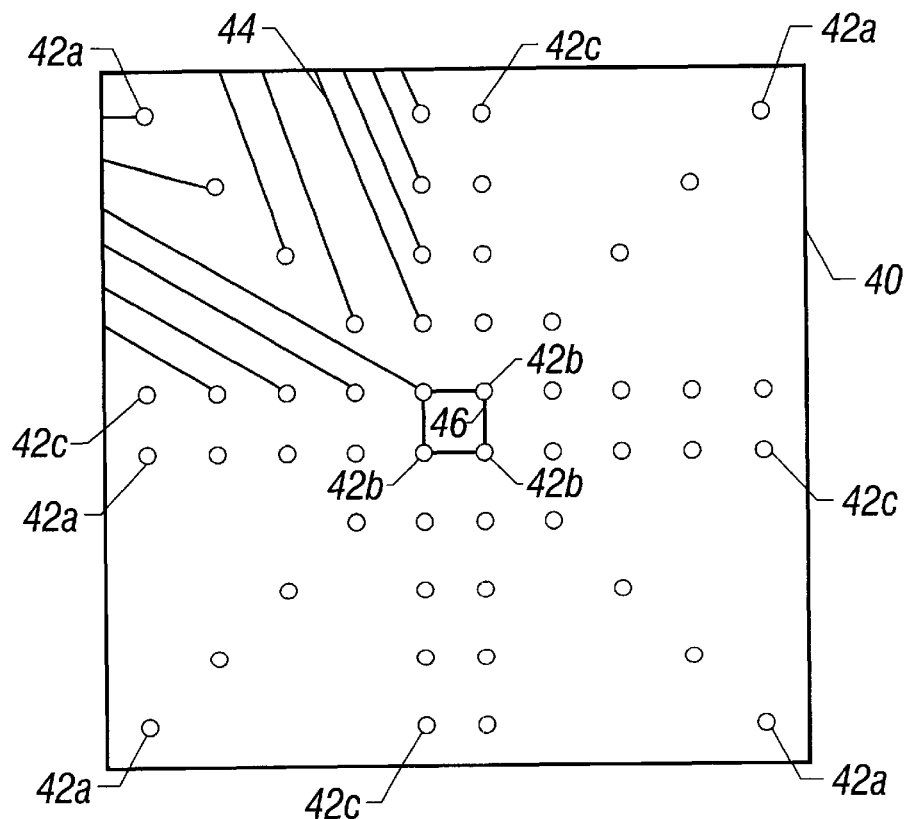
FIG. 4 is an illustration of a footprint of a rectangular package or die using the variable pitch layout of the present invention.

FIG. 4 is an illustration of a footprint of a rectangular package using the progressive variable pitch layout of the present invention. Contacts 42 are positioned on the substrate 40 in a pattern designed to most efficiently utilize the footprint of the substrate 40. The progressive layout of the grid array of the present invention positions the contacts 42 at the central region of the substrate 40 closer together than the contacts 42 at the outer region of the substrate 40. In other words, as the array of contacts 42 is traversed from the central most point to the outside edge of the substrate 40, the spacing between the contacts 42 increases. In this manner, there is room for the numerous traces 44 to pass between the contacts 42 along the outer region of the substrate 40.

In FIG. 4, note that the relative size of the contacts 42 is approximately the same both at the central and outer regions of the substrate 40. Although the exact spacing between the contacts 42 is a design decision based upon the desired number of contacts 42 and routing channels 44 in a given design, FIG. 4 provides an illustrative spacing for one embodiment of a rectangular grid array package utilizing the progressive variable pitch layout of the present invention. In this embodiment, no routing channels 44 pass between the inner contacts 42b, but the spacing between outer contacts 42a allow for 6 routing channels to pass between the outer contacts 42a.

Contacts 42c have been removed for handling purposes. The number of contacts 42c removed for handling and their given location within the grid array is purely a design decision. Note also that a power and a ground ring 46 may be placed anywhere along the grid array but will typically be located near the central region of the substrate 40 as shown.

TABLE 1

| No of lines between contacts | Pitch (mils) | Lines in Circular Substrate * | Lines in Square Substrate ** | Square Substrate (50 mil fixed pitch) |
|---|---|---|---|---|
| 2 | 50 | 212 | 260 | 236 |
| 3 | 60 | 236 | 290 | 236 |
| 4 | 70 | 253 | 312 | 236 |
| 5 | 80 | 266 | 329 | 236 |
| 6 | 90 | 276 | 341 | 236 |

* Four contacts are taken off from the circular design for handling purposes.
** Sixteen contacts are taken off from the square design for handling purposes.

Table 1 (above) illustrates the gain in the number of input/output connections (i.e. traces, lines, routing channels) for a variable land pitch LGA design. The first column shows the maximum number of signal lines or traces that can pass between two contacts. The second column lists the pitch in mils of the contacts along the outer region (i.e., the first row) of the substrate. The third column shows the number of signal lines possible in a circular substrate having outer region contacts spaced at the given pitch of Column 2. The fourth column shows the number of signal lines possible in a rectangular substrate having outer region contacts spaced at the given pitch of Column 2. The fifth column shows the number of signal lines possible, 236, in the traditional square, 50 mil fixed pitch grid array. For example, with a circular variable pitch layout with the exterior contacts spaced at 70 mils, 253 signal lines may be routed as compared to the 236 lines of a traditional fixed pitch layout. Similarly, with a square variable pitch layout with the exterior contacts spaced at 70 mils, 312 signal liens may be routed as compared to the 236 lines of a traditional fixed pitch layout.

The progressive variable pitch layout of the present invention provides a more efficient layout of electrical connections. The present invention provides a way of increasing density without increasing either the complexity of the apparatus' construction or the cost of fabrication. For example, with the fixed pitch grid array substrates, wires having high-density traces were required to establish the electrical connection due to the minimal amount of space available. Now, due to the progressive spacing of the contacts, the same results previously achieved can be replicated with a more relaxed structure. Or, using both high density traces and a variable pitch grid array, the apparatus' design complexity can be increased. In other words, a variable pitch grid array allows for a more compact and dense device without use of additional layers, or allows for even more complexity over current capabilities through use of multiple layers having a variable pitch grid array.

The present invention also provides unique advantages when electrically coupling a device to a PCB or when electrically coupling multiple PCB's. For example, standard low-end motherboards generally allow 2 tracks between lands. By using a progressive pitch layout, a multiple layer motherboard may not be needed since more than two tracks can pass between exterior lands. Thus, the number of board layers might be reduced, which would also result in a reduction in the cost of fabrication.

The above described embodiments provide advantages over the current fixed grid array used on integrated circuit dies, packages, and printed circuit boards by providing a grid array where every row has a different pitch. In this manner, the number of contacts (e.g., solder bumps) lost due to the larger pitch on the exterior region of the substrate is compensated for by an increased number of contacts having a smaller pitch located at the interior region of the substrate. This progressively variable pitch grid array layout allows a given design to maximize the number of signal lines (or routing channels) available for a given layer. By increasing the number of signal lines per layer, performance of the device is increased without the added requirement and cost of additional signal layers.

We claim:

1. A semiconductor package comprising:
    a substrate having a surface, said surface having a central region and an outer region; and
    a first plurality of rows of electrical connections on said surface, each of said rows extending from the central region to the outer region;
    wherein a space between every pair of adjacent rows of the first plurality of rows is progressively larger from the central region to the outer region to contain a progressively increasing number of conductive traces, said space containing no electrical connections;
    wherein none of the electrical connections in each row are directly connected to one another electrically.

2. The package of claim 1 wherein said electrical connections are selected from a group comprising input/output connections, power connections, and ground connections.

3. The package of claim 1 wherein said electrical connections comprise an array of electrically conductive bumps.

4. The package of claim 1, further comprising:
    a semiconductor die coupled to the substrate and having a second plurality of rows of electrical connections positioned to match the first plurality of rows of electrical connections responsive to the semiconductor die being coupled to the substrate.

5. The package of claim 1, wherein each of said rows extends radially from the central region to the outer region.

6. A device comprising:
    an integrated circuit die having a surface, said surface having a central region and an outer region; and
    a first plurality of rows of electrical connections on said surface, each of said rows extending from the central region to the outer region;
    a space between each adjacent row, each of the spaces containing no electrical connections;
    wherein an average of all the spaces is progressively non-decreasing from the central region to the outer region.

7. The device of claim 6 wherein said average of all the spaces is progressively increasing from the central region to the outer region.

8. The device of claim 6 wherein said electrical connections comprise an array of electrically conductive bumps.

9. The device of claim 6 wherein said first plurality of rows of electrical connections are positioned on said surface in a pattern to match a second plurality of rows of electrical connections on a substrate responsive to said integrated circuit die being coupled to said substrate.

10. The device of claim 6 wherein each of said rows extends radially from the central region to the outer region.

11. An apparatus comprising:
    a substrate having a first surface, said first surface having a central region and an outer region;
    a first plurality of rows of electrical connections on said first surface, each of said rows extending from the central region to the outer region, wherein a space between ones of the electrical connections at substantially a same distance from the central region of the first plurality of rows is progressively larger from the central region to the outer region, said space containing no electrical connections; and
    a semiconductor die coupled to the substrate and having a second plurality of rows of electrical connections.

12. The apparatus of claim 11 wherein a space between adjacent rows of the first plurality of rows is progressively increasing from the central region to the outer region.

13. The apparatus of claim 11 wherein said first plurality of rows of electrical connections are positioned on said surface in a pattern to match the second plurality of rows of electrical connections responsive to said semiconductor die being coupled to said substrate.

14. The apparatus of claim 11, wherein each of said rows extends radially from the central region to the outer region.

15. A device, comprising:
    a substrate having a surface, said surface having a central region and an outer region, and
    a first plurality of rows of electrical connections on said surface, each row extending from the central region to the outer region;
    a plurality of conductive traces connected to at least some of the electrical connections and disposed between adjacent ones of the first plurality of rows;
    wherein a space between the adjacent ones of the first plurality of rows is progressively larger from the cen tral region to the outer region to contain a progressively increasing number of the conductive traces, said space containing no electrical connections.

16. The device of claim 15 wherein said electrical connections are selected from a group comprising input/output connections, power connections, and ground connections.

17. The device of claim 15 wherein said electrical connections comprise an array of electrically conductive bumps.

18. The device of claim 15, further comprising:
a semiconductor die coupled to the substrate and having a second plurality of rows of electrical connections positioned to match the first plurality of rows of electrical connections responsive to the semiconductor die being coupled to the substrate.

* * * * *